US012732139B2

(12) United States Patent
Leipold et al.

(10) Patent No.: US 12,732,139 B2
(45) Date of Patent: Sep. 8, 2026

(54) BROADBAND LNA STRUCTURE USING OFFSET ACTIVE COUPLED SEGMENTS

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 531 days.

(21) Appl. No.: 18/266,241

(22) PCT Filed: Dec. 20, 2021

(86) PCT No.: PCT/US2021/064418

§ 371 (c)(1),
(2) Date: Jun. 8, 2023

(87) PCT Pub. No.: WO2022/133352

PCT Pub. Date: Jun. 23, 2022

(65) Prior Publication Data

US 2024/0039482 A1 Feb. 1, 2024

Related U.S. Application Data

(60) Provisional application No. 63/127,467, filed on Dec. 18, 2020.

(51) Int. Cl.
*H03F 1/42* (2006.01)
*H03F 1/08* (2006.01)
(Continued)

(52) U.S. Cl.
CPC ............... *H03F 1/42* (2013.01); *H03F 1/083* (2013.01); *H03F 1/3205* (2013.01); *H03F 3/211* (2013.01);
(Continued)

(58) Field of Classification Search
CPC .......... H03F 1/42; H03F 1/083; H03F 1/3205; H03F 3/211; H03F 3/45475;
(Continued)

(56) References Cited

FOREIGN PATENT DOCUMENTS

NO 2010141908 A1 12/2010
WO WO-2010141908 A1 * 12/2010 ......... H03F 3/45179

OTHER PUBLICATIONS

Entesari K et al: "CMOS Distributed Amplifiers With Extended Flat Bandwidth and Improved Input Matching Using Gate Line With Coupled Inductors", IEEE Transactions On Microwave Theory and Techniques, IEEE, USA, vol. 36, No. 12, Dec. 9, 2009, pp. 2862-2871, XP011284078, ISSN: 0018-9480 (Year: 2009).*

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A broadband low noise amplifier (LNA) structure (10) includes a main LNA (12), an offset LNA (14), an input splitter (16), and an output combiner (18). The input splitter (16) is configured to split a radio frequency (RF) input signal into a first RF input signal and a second RF input signal with difference phases, which are fed to the main LNA (12) and the offset LNA (14), respectively. Based on the first RF input signal, the main LNA (12) is configured to provide a first RF output signal, and based on the second RF input signal, the offset LNA (14) is configured to provide a second RF output signal. The output combiner (18) is configured to realign the first RF output signal and the second RF output signal, and configured to combine the first and second RF output signals to provide a combined RF output signal.

30 Claims, 7 Drawing Sheets

(51) Int. Cl.
*H03F 1/32* (2006.01)
*H03F 3/21* (2006.01)
*H03F 3/45* (2006.01)

(52) U.S. Cl.
CPC ... *H03F 3/45475* (2013.01); *H03F 2200/294* (2013.01); *H03F 2200/39* (2013.01); *H03F 2200/451* (2013.01); *H03F 2200/492* (2013.01)

(58) Field of Classification Search
CPC ........... H03F 2200/294; H03F 2200/39; H03F 2200/451; H03F 2200/492; H03F 1/223; H03F 2200/489; H03F 3/195
USPC .......................................................... 330/295
See application file for complete search history.

(56) References Cited

OTHER PUBLICATIONS

Hee-Tae Ahn et al: "A 0.5-8.5-GHz Fully Differential CMOS Distributed Amplifier", IEEE Journal of Solid-State Circuits, IEEE, USA, vol. 37, No. 8, Aug. 1, 2002 (Aug. 1, 2002), XP011065808, ISSN: 0018-9200 (Year: 2002).*

Shumail Hira et al: "Fully integrated, highly linear, wideband LNA in 0.13[mu]m CMOS techno", 2013 IEEE Symposium On Wireless Technology & Applications (ISWTA), IEEE, Sep. 22, 2013 (Sep. 22, 2013), pp. 338-342, XP032531873, ISSN: 2324-7843, DOI: 10.1109/ISWTA.2013.6688799 (Year: 2013).*

Anh, H.-T. et al., "A 0.5-8.5-GHz Fully Differential CMOS Distributed Amplifier," IEEE Journal of Solid-State Circuits, vol. 37, No. 8, Aug. 2002, IEEE, pp. 985-993.

Entesari, K. et al., "CMOS Distributed Amplifiers With Extended Flat Bandwidth and Improved Input Matching Using Gate Line With Coupled Inductors," IEEE Transactions on Microwave Theory and Techniques, vol. 57, No. 12, Dec. 2009, IEEE, pp. 2862-2871.

Kimura, S. et al., "GaAs MESFET distributed baseband amplifier IC with allpass filter network," Electronics Letters, vol. 34, No. 22, Oct. 1998, 2 pages.

Shumail, H. et al., "Fully Integrated, Highly Linear, Wideband LNA in 0.13μm CMOS Technology," 2013 IEEE Symposium on Wireless Technology and Applications (ISWTA), Sep. 22-25, 2013, Kuching, Malaysia, IEEE, 5 pages.

International Search Report and Written Opinion for International Patent Application No. PCT/US2021/064418, mailed Apr. 21, 2022, 19 pages.

* cited by examiner

BROADBAND LNA STRUCTURE USING OFFSET ACTIVE COUPLED SEGMENTS

RELATED APPLICATIONS

This application is a 35 USC 371 national phase filing of International Application No. PCT/US2021/064418, filed Dec. 20, 2021, which claims the benefit of provisional patent application Ser. No. 63/127,467, filed Dec. 18, 2020, the disclosures of which are incorporated herein by reference in their entireties.

FIELD OF THE DISCLOSURE

The technology of the disclosure relates to a low noise amplifier (LNA) structure, and more particularly to a broadband LNA structure including a main LNA combined with one or more offset LNAs for widening bandwidth.

BACKGROUND

The fifth-generation (5G) standards have introduced new bands that have relatively large fractional bandwidths ranging from 25% to 30%. One example is the n77 band 3.3 GHz-4.2 GHz with about 25% fractional bandwidth. As such, 5G front-end modules (FEMs) have to meet a low noise figure (NF) over wide frequency bands with fractional bandwidth at or above the 25% level.

Low noise amplifiers (LNAs) are key components in the FEMs. However, conventional single-ended LNAs that utilize low order inductor-capacitor (LC) matching networks may only provide a modest radio frequency (RF) signal bandwidth, usually ranging from 10% to 15%, which cannot not meet the bandwidth requirements for 5G FEMs. For a wide frequency bandwidth at or above the 25% level, achieving a low NF is a challenge. Using high order LC matching networks can widen the bandwidth but will come with a large insertion loss and also a large implementation footprint, with a large number of components.

Accordingly, there is an object of the present disclosure to provide an improved LNA structure design, which can meet the challenging wide bandwidth requirements of 5G FEMs without sacrificing the NF of the structure. In addition, there is also a need to retain a relatively small implementation footprint and a relatively small number of components.

SUMMARY

The present disclosure relates to a broadband low noise amplifier (LNA) structure including a main LNA combined with one or more offset LNAs for widening bandwidth. According to one embodiment, the disclosed broadband LNA structure includes a main LNA, an offset LNA, an input splitter, and an output combiner. The input splitter is configured to split a radio frequency (RF) input signal into a first RF input signal and a second RF input signal with difference phases, which are fed to the main LNA and the offset LNA, respectively. Based on the first RF input signal, the main LNA is configured to provide a first RF output signal, and based on the second RF input signal, the offset LNA is configured to provide a second RF output signal. The output combiner is configured to re-align the first RF output signal and the second RF output signal by decrease the phase difference between the first RF output signal and the second RF output signal, and configured to combine the first and second RF output signals to provide a combined RF output signal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
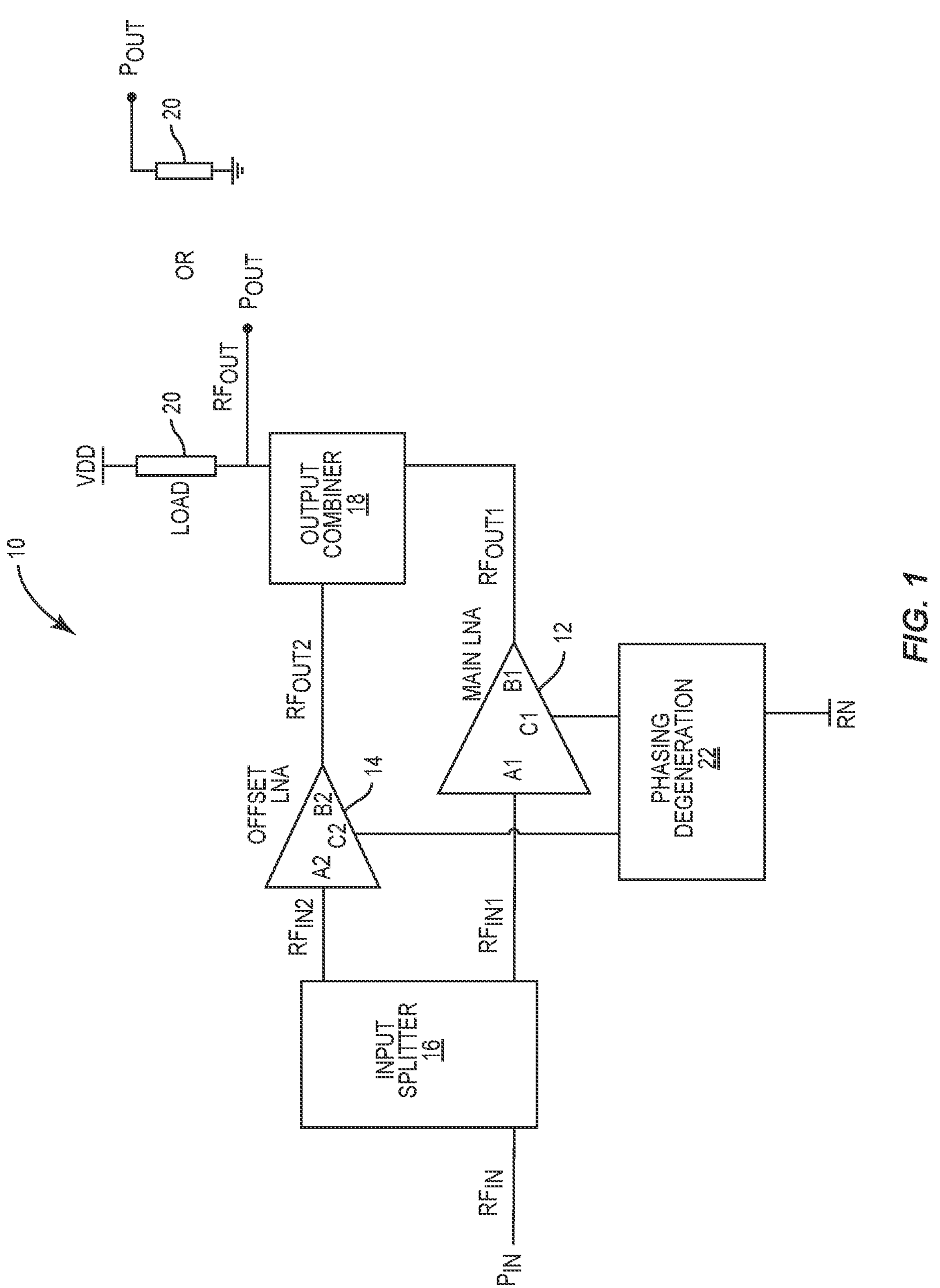
FIG. 1 illustrates an exemplary broadband low noise amplifier (LNA) structure including a main LNA and an offset LNA according to an embodiment of the present disclosure.

It will be understood that for clear illustrations, FIGS. 1-7B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a broadband low noise amplifier (LNA) structure, which utilizes a main LNA combined with an active offset LNA. FIG. 1 illustrates an exemplary broadband LNA structure 10 that includes a main LNA 12, an offset LNA 14, an input splitter 16, and an output combiner 18, according to an embodiment of the present disclosure. Herein, the main LNA 12 and the offset LNA 14 are parallel to each other and are interconnected using the input splitter 16 and the output combiner 18.

In detail, the input splitter 16 is connected to an input port $P_{IN}$, and is configured to split a radio frequency (RF) input signal $RF_{IN}$ received at the input port $P_{IN}$ into a first RF input signal $RF_{IN1}$ and a second RF input signal $RF_{IN2}$, which have different signal phases (e.g., phase shifting in the input splitter 16). The main LNA 12 is configured to receive the first RF input signal $RF_{IN1}$ and provide a first RF output signal $RF_{OUT1}$, while the offset LNA 14 is configured to receive the second RF input signal $RF_{IN2}$ and provide a second RF output signal $RF_{OUT2}$. As such, the main LNA 12 and the offset LNA 14 will work on different phases of the RF input signal $RF_{IN}$, and the offset LNA 14 will have a frequency transfer function that is offset in frequency from the main LNA 12. The first RF output signal $RF_{OUT1}$ and the second RF output signal $RF_{OUT2}$ have different signal phases at least due to the phase difference between the first RF input signal $RF_{IN1}$ and the second RF input signal $RF_{IN2}$. The output combiner 18 is configured to receive the first RF output signal $RF_{OUT1}$ from the main LNA 12 and the second RF output signal $RF_{OUT2}$ from the offset LNA 14, configured to re-align the first RF output signal $RF_{OUT1}$ and the second RF output signal $RF_{OUT2}$ (e.g., reduce the phase difference between the first RF output signal $RF_{OUT1}$ and the second RF output signal $RF_{OUT2}$, opposite phase shifting in the output combiner 18 compared to the phase shifting in the input splitter 16), and configured to combine the first RF output signal $RF_{OUT1}$ and the second RF output signal $RF_{OUT2}$ to provide a combined RF output signal $RF_{OUT}$ to the output port $P_{OUT}$. Herein, the phase shifting in the input splitter 16 provides phase-shifted signal paths through the main LNA 12 and the offset LNA 14, respectively. Combining the phase shifted signal paths will result in a broad bandwidth of the broadband LNA structure 10.

In some applications, the broadband LNA structure 10 may further include a load structure 20, which may be connected between the output port $P_{OUT}$ and a power supply $V_{DD}$ or connected between the output port $P_{OUT}$ and ground. In one embodiment, the load structure 20 may be implemented by one or more passive components (e.g., inductors, capacitors, and/or resistors). In an alternative embodiment, the load structure 20 may further include active devices (e.g., field-effect-transistors, bipolar junction transistors, heterojunction bipolar transistors, etc.).

In some applications, the broadband LNA structure 10 may further include a phasing degeneration block 22, which is configured to assist with the phase shifting between a main signal path (i.e., a path through the main LNA 12) and an offset signal path (i.e., a path through the offset LNA 14). The phasing degeneration block 22 provides degeneration impedances to the main LNA 12 and the offset LNA 14. The transconductance gain of the main LNA 12/the offset LNA 14 is dependent on the corresponding degeneration impedance. If the degeneration impedance is real (e.g., resistive), no phase shift is created in the main LNA 12/offset LNA 14 itself. If the degeneration impedance is complex (e.g. inductive), main LNA 12/offset LNA 14 itself will create additional phase shift that is contributing to the overall phase difference between the main signal path and the offset signal path. The total phase difference is the summation between the passive network phase shift (e.g., from the input splitter 16) and the active phase shift (e.g., from the main LNA 12 and the offset LNA 14).

The phasing degeneration block 22 may also be configured to improve the linearity of the main LNA 12 and the offset LNA 14. The phasing degeneration block 22 are connected between the main LNA 12 and a reference level RL (e.g., ground) and between the offset LNA 14 and the reference level RL (e.g., ground). When the phasing degeneration block 22 is omitted in the broadband LNA structure 10, the main LNA 12 and the offset LNA 14 may be directly connected to the reference level RL (e.g., ground), respectively.

Figure 2:
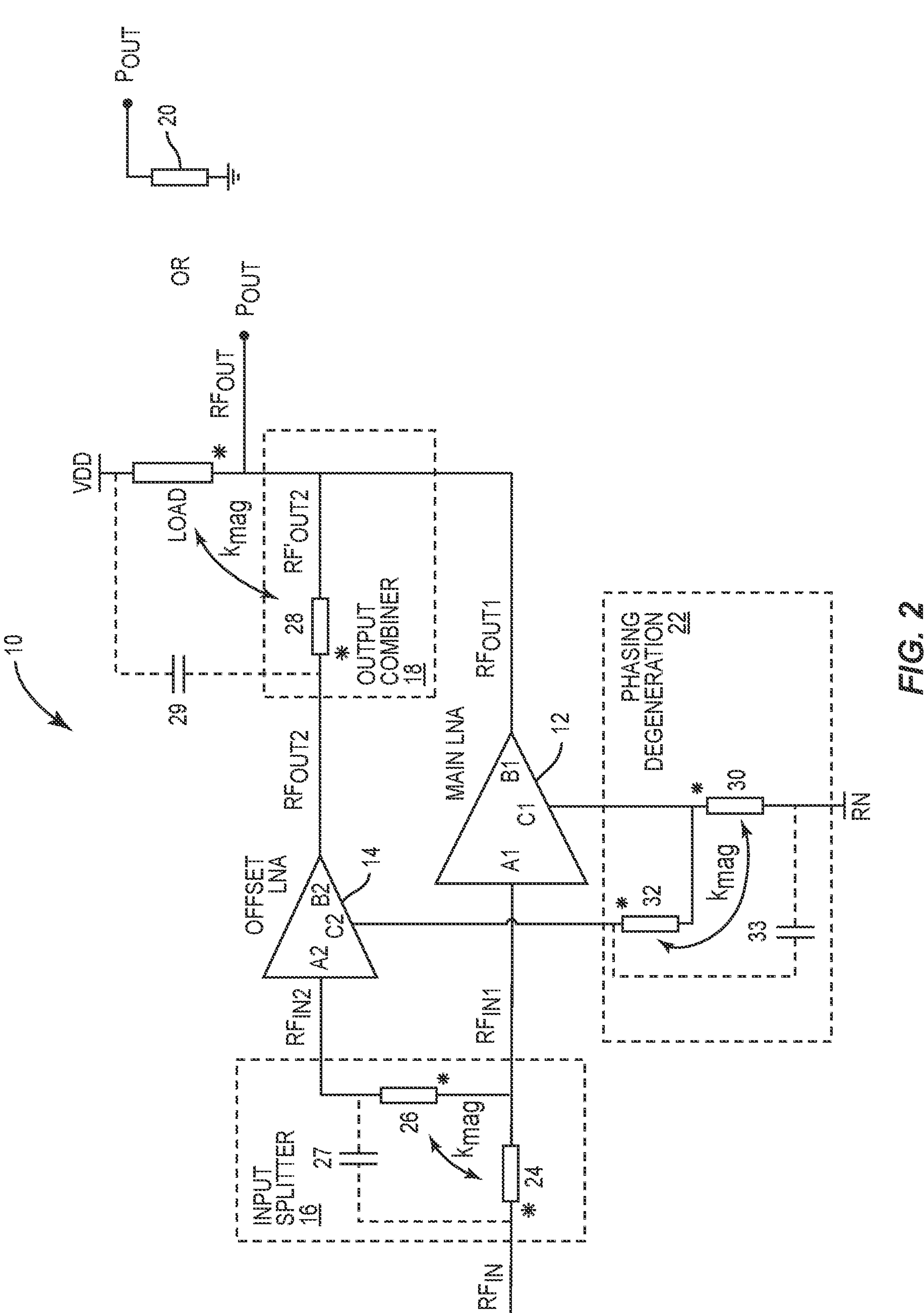
FIG. 2 illustrates an exemplary implementation of the broadband LNA structure shown in FIG. 1.

The broadband LNA structure 10 can be implemented either on-chip, on the laminate or a combination of the two. FIG. 2 illustrates an exemplary implementation of the broadband LNA structure 10 shown in FIG. 1. In one embodiment, the input splitter 16 may be achieved by a main input inductance 24 and an offset input inductance 26. The main input inductance 24 is connected between the input port $P_{IN}$ and a terminal A1 of the main LNA 12, and the offset input inductance 26 is connected between the main input inductance 24 and a terminal A2 of the offset LNA 14. The terminal A1 of the main LNA 12 is a terminal to receive the first RF input signal $RF_{IN1}$, and the terminal A2 of the offset LNA 14 is a terminal to receive the second RF input signal $RF_{IN2}$. As such, the main input inductance 24 is connected between the input port $P_{IN}$ and the main LNA 12, while the main input inductance 24 and the offset input inductance 26 are connected in series between the input port $P_{IN}$ and the offset LNA 14. Different inductances lead to different phase shifts. In consequence, the input signal $RF_{IN}$ received at the input port $P_{IN}$ can be split into two signals (i.e., the first RF input signal $RF_{IN1}$ and the second RF input signal $RF_{IN2}$) with different phases.

The main input inductance 24 and the offset input inductance 26 may each be implemented by one or more inductors (e.g., on-chip inductors, printed circuit inductors, or surface mounted inductors). In one embodiment, the main input inductance 24 and the offset input inductance 26 may also be magnetically coupled, electrically coupled via a coupling capacitor 27, or both magnetically and electrically coupled. As such, the main input inductance 24 and the offset input inductance 26 may form an auto-transformer or a galvanic isolated transformer. Two or more turns may be included in the transformer. Notice that the input splitter 16 may include a second or higher order passive network, which could provide the phase shifting in the main signal path (i.e., the path through the main LNA 12) and the offset signal path (i.e., the path through the offset LNA 14). Typically, the higher order of the input splitter 16, the larger phase shift between the main signal path and the offset signal path.

In one embodiment, the output combiner 18 may be achieved by an offset output inductance 28. Herein, the offset output inductance 28 is connected between a terminal B2 of the offset LNA 14 and the output port $P_{OUT}$, while a terminal B1 of the main LNA 12 is directly connected to the output port $P_{OUT}$. The terminal B1 of the main LNA 12 is a terminal to provide the first RF output signal $RF_{OUT1}$, and the terminal B2 of the offset LNA 14 is a terminal to provide the second RF output signal $RF_{OUT2}$. The offset output inductance 28 is configured to decrease the phase difference between the first RF output signal $RF_{OUT1}$ and the second RF output signal $RF_{OUT2}$, which at least comes from the phase difference between the first RF input signal $RF_{IN1}$ and the second RF input signal $RF_{IN2}$. As such, the offset output inductance 28 is configured to re-align the first RF output signal $RF_{OUT1}$ and the second RF output signal $RF_{OUT2}$. In consequence, a shifted second RF output signal $RF'_{OUT2}$ (after the offset output inductance 28) and the first RF output signal $RF_{OUT1}$ may have a substantially same phase, and can be added as one combined RF output signal $RF_{OUT}$ to the output port $P_{OUT}$. The offset output inductance 28 may be implemented by one or more inductors (e.g., on-chip inductors, printed circuit inductors, or surface mounted inductors). In one embodiment, the offset output inductance 28 and the load structure 20 may also be magnetically coupled, electrically coupled via a coupling capacitor 29, or both magnetically and electrically coupled. As such, the offset output inductance 28 and the load structure 20 may form an auto-transformer or a galvanic isolated transformer. Two or more turns may be included in the transformer.

In one embodiment, the phasing degeneration block 22 may be achieved by a main degeneration inductance 30 and an offset degeneration inductance 32. The main degeneration inductance 30 is connected between a terminal C1 of the main LNA 12 and the reference level RL (e.g., ground), and the offset degeneration inductance 32 is connected between a terminal C2 of the offset LNA 14 and the main degeneration inductance 30. As such, the main degeneration inductance 30 is connected between the main LNA 12 and the reference level RL (e.g., ground), while the offset degeneration inductance 32 and the main degeneration inductance 30 are connected in series between the offset LNA 14 and the reference level RL (e.g., ground). Due to the different degeneration impedances for the main LNA 12 and the offset LNA 14, there will be additional phase shift generated between the main LNA 12 and the offset LNA 14, which will contribute to the overall phase difference between the main signal path and the offset signal path. In addition, the main degeneration inductance 30 matches the main input inductance 24, so as to improve the linearity of the main LNA 12. A combination of the offset degeneration inductance 32 and the main degeneration inductance 30 matches a combination of the offset input inductance 26 and the main input inductance 24, so as to improve the linearity of the offset LNA 14.

The main degeneration inductance 30 and the offset degeneration inductance 32 may each be implemented by one or more inductors (e.g., on-chip inductors, printed circuit inductors, or surface mounted inductors). In one embodiment, the main degeneration inductance 30 and an offset degeneration inductance 32 may be magnetically coupled, electrically coupled via a coupling capacitor 33, or both magnetically and electrically coupled. As such, the main degeneration inductance 30 and the offset degeneration inductance 32 may form an auto-transformer or a galvanic isolated transformer. Two or more turns may be included in the transformer. Notice that the phasing degeneration block 22 may include a second or higher order passive network, which could provide the additional phase shifting in the main signal path (i.e., the path through the main LNA 12) and the offset signal path (i.e., the path through the offset LNA 14). Typically, the higher order of the phasing degeneration block 22, the larger phase shift will be added between the main signal path and the offset signal path.

Figure 3B:
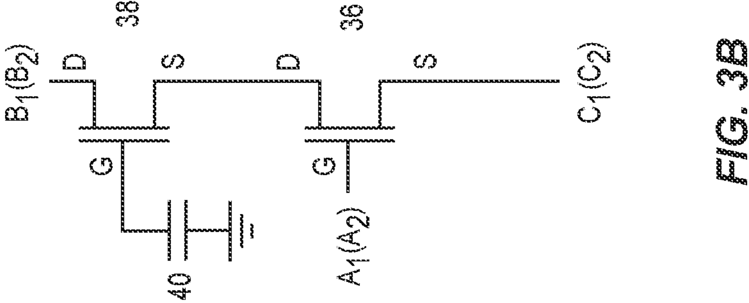
FIGS. 3A and 3B illustrate configuration details of the main LNA and the offset LNA shown in FIG. 2.
Figure 3A:
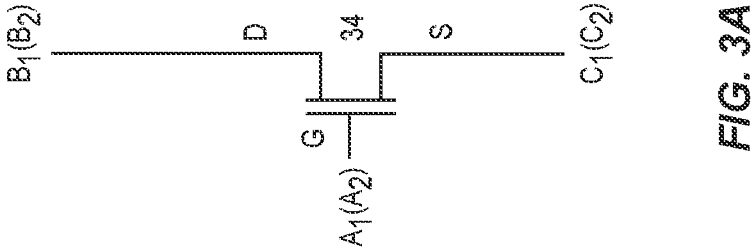

In addition, the main LNA 12 and the offset LNA 14 may be implemented by one or more transistors, such as bipolar junction transistors (BJTs), hetero-junction bipolar transistors (HBTs), metal-oxide-semiconductor field-effect transistors (MOSFETs) in bulk complementary metal-oxide-semiconductors (CMOS) or Silicon on insulator (SOI) CMOS, pseudomorphic high-electron-mobility transistors (pHEMTs), junction-gate field-effect transistors (JFETs), and etc. FIGS. 3A and 3B provide a configuration of one LNA (applying to either the main LNA 12 or the offset LNA 14). As illustrated in FIG. 3A, the main LNA 12/offset LNA 14 may be implemented by a field-effect transistor (FET) 34. A drain of the FET 34 is the terminal B1 of the main LNA 12/the terminal B2 of the offset LNA 14, a source of the FET 34 is the terminal C1 of the main LNA 12/the terminal C2 of the offset LNA 14, and a gate of the FET 34 is the terminal A1 of the main LNA 12/the terminal A2 of the offset LNA 14. If the phasing degeneration block 22 exists, the main degeneration inductance 30 is connected between the source of the FET 34 for the main LNA 12 and the reference level RL (e.g., ground), while the offset degeneration inductance 32 and the main degeneration inductance 30 are connected in series between the source of the FET 34 for the offset LNA 14 and the reference level RL (e.g., ground). When the FET 34 is a long channel FET, the phasing degeneration block 22 may be omitted. In such case, the source of the FET 34 for the main LNA 12 is directly connected to ground, and the source of the FET 34 for the offset LNA 14 is directly connected to the reference level RL (e.g., ground). The FET 34 may be a MOSFET or JFET, or may be replaced by a BJT, an HBT, or a pHEMT.

In FIG. 3B, the main LNA 12/offset LNA 14 may be implemented by a first FET 36, a second FET 38, and a capacitor 40. A source of the first FET 36 is the terminal C1 of the main LNA 12/the terminal C2 of the offset LNA 14, and a gate of the first FET 36 is the terminal A1 of the main LNA 12/the terminal A2 of the offset LNA 14. The first FET 36 and the second FET 38 are connected in series, such that a drain of the first FET 36 is connected to a source of the second FET 38. A gate of the second FET 38 is connected to ground through the capacitor 40, and a drain of the second FET 38 is the terminal B1 of the main LNA 12/the terminal B2 of the offset LNA 14. If the phasing degeneration block 22 exists, the main degeneration inductance 30 is connected between the source of the first FET 36 for the main LNA 12 and the reference level RL (e.g., ground), while the offset degeneration inductance 32 and the main degeneration inductance 30 are connected in series between the source of the first FET 36 for the offset LNA 14 and the reference level RL (e.g., ground). When the first FET 36 is a long channel FET, the phasing degeneration block 22 may be omitted. In such case, the source of the first FET 36 for the main LNA 12 is directly connected to the reference level RL (e.g., ground), and the source of the first FET 36 for the offset LNA 14 is directly connected to the reference level RL (e.g., ground). The first FET 36 and the second FET 38 may each be a MOSFET or JFET, or may be replaced by a BJT, an HBT, or a pHEMT.

Figure 4:
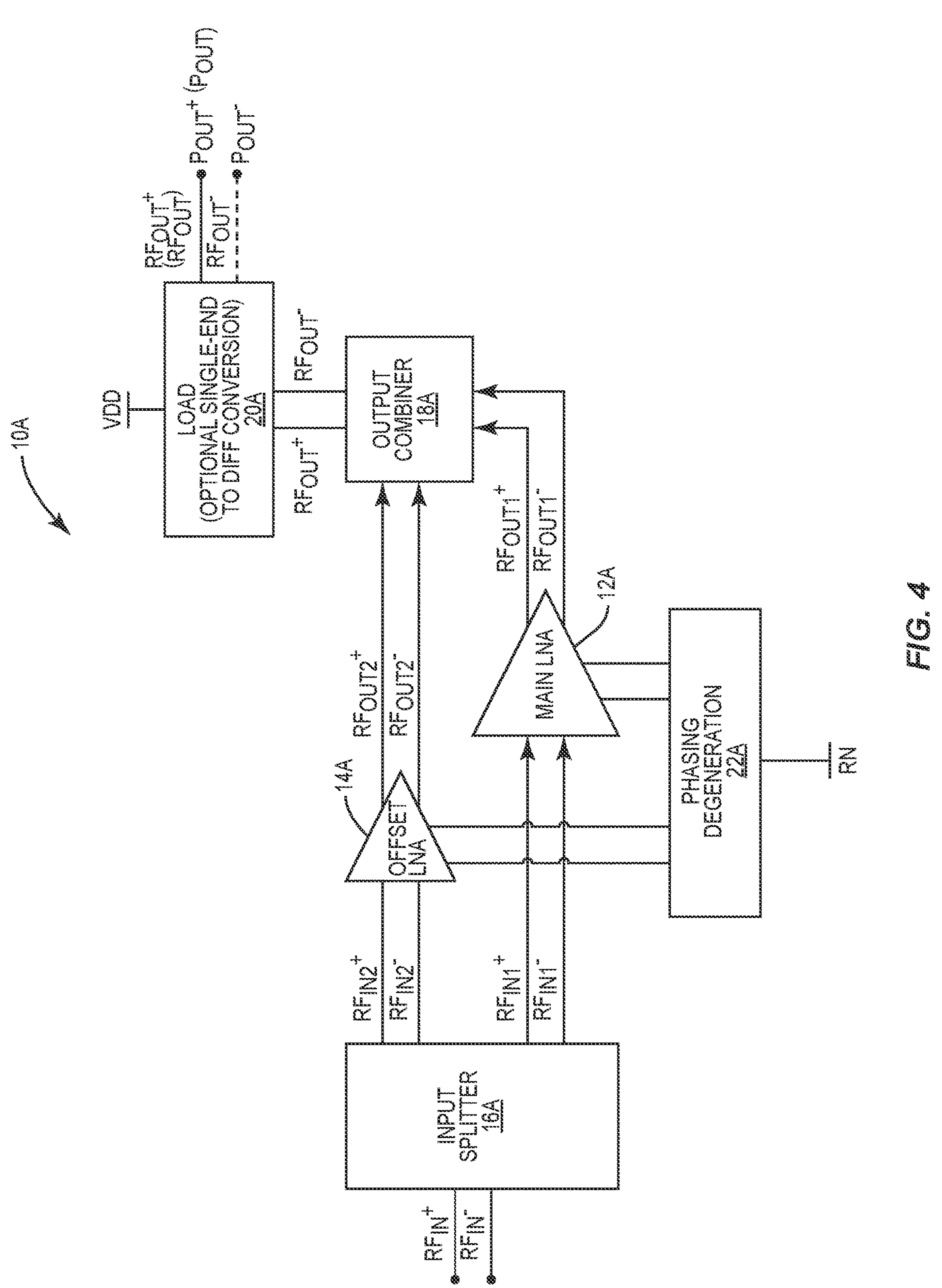
FIGS. 4-6 illustrate an alternative broadband LNA structure according to an embodiment of the present disclosure.

The broadband LNA structure 10 illustrated in FIG. 1 is a single-ended structure. In some applications, differential configurations might be utilized. FIG. 4 illustrates an alternative broadband LNA structure 10A with differential configurations. The alternative broadband LNA structure 10A includes an alternative main LNA 12A, an alternative offset LNA 14A, an alternative input splitter 16A, and an alternative output combiner 18A, which are configured to achieve the same functionalities as the main LNA 12, the offset LNA 14, the input splitter 16, and the output combiner 18, respectively. Each of the alternative main LNA 12A, the alternative offset LNA 14A, the alternative input splitter 16A, and the alternative output combiner 18A receives a pair of differential signals and provides another pair of differential signals to a next stage/component.

The alternative main LNA 12A and the alternative offset LNA 14A are also parallel to each other and are interconnected using the alternative input splitter 16A and the alternative output combiner 18A. In detail, the alternative input splitter 16A is connected to a pair of input ports $P_{IN^+}$ and $P_{IN^-}$, and is configured to split a pair of RF input signals $RF_{IN^+}$ and $RF_{IN^-}$ into a pair of first RF input signals $RF_{IN1^+}$ and $RF_{IN1^-}$ and a pair of second RF input signals $RF_{IN2^+}$ and $RF_{IN2^-}$. The pair of first RF input signals $RF_{IN1^+}$ and $RF_{IN1^-}$ and the pair of second RF input signals $RF_{IN2^+}$ and $RF_{IN2^-}$ have different signal phases, respectively. The alternative main LNA 12A is configured to receive the pair of first RF input signals $RF_{IN1^+}$ and $RF_{IN1^-}$ and provide a pair of first RF output signals $RF_{OUT1^+}$ and $RF_{OUT1^-}$. The alternative offset LNA 14A is configured to receive the pair of second RF input signals $RF_{IN2^+}$ and $RF_{IN2^-}$ and provide a pair of second RF output signals $RF_{OUT2^+}$ and $RF_{OUT2^-}$. As such, the alternative main LNA 12A and the alternative offset LNA 14A will work on different phases of the pair of RF input signals $RF_{IN^+}$ and $RF_{IN^-}$, and the alternative offset LNA 14A will have a frequency transfer function that is offset in frequency from the alternative main LNA 12A. Herein, the pair of first RF output signals $RF_{OUT1^+}$ and $RF_{OUT1^-}$ and the pair of second RF output signals $RF_{OUT2^+}$ and $RF_{OUT2^-}$ have different signal phases, respectively, due to the phase differences between the pair of first RF input signals $RF_{IN1^+}$ and $RF_{IN1^-}$ and the pair of second RF input signals $RF_{IN2^+}$ and $RF_{IN2^-}$. The alternative output combiner 18A is configured to receive the pair of first RF output signals $RF_{OUT1^+}$ and $RF_{OUT1^-}$ from the alternative main LNA 12A and the pair of second RF output signals $RF_{OUT2^+}$ and $RF_{OUT2^-}$ from the alternative offset LNA 14A, configured to re-align the pair of first RF output signals $RF_{OUT1^+}$ and $RF_{OUT1^-}$ and the pair of second RF output signals $RF_{OUT2^+}$ and $RF_{OUT2^-}$, respectively (e.g., reduce the phase differences between the pair of first RF output signals $RF_{OUT1^+}$ and $RF_{OUT1^-}$ and the pair of second RF output signals $RF_{OUT2^+}$ and $RF_{OUT2^-}$), and configured to combine the pair of first RF output signals $RF_{OUT1^+}$ and $RF_{OUT1^-}$ and the pair of second RF output signals $RF_{OUT2^+}$ and $RF_{OUT2^-}$ to provide a pair of combined RF output signals $RF_{OUT^+}$ and $RF_{OUT^-}$. Herein, the phase shifting in the alternative input splitter 16A provides phase-shifted signal paths through the alternative main LNA 12A and the alternative offset LNA 14A, respectively. Combining the phase-shifted signal paths will result in a broad bandwidth of the alternative broadband LNA structure 10A.

In this embodiment, the alternative broadband LNA structure 10A may further include an alternative load structure 20A, which is configured to achieve a same functionality as the load structure 20 and optionally configured to convert differential signals back to single-end signal (e.g., utilizing a transformer). Herein, the pair of combined RF output signals $RF_{OUT^+}$ and $RF_{OUT^-}$ are fed to the alternative load structure 20A, and a single-end output signal $RF_{OUT}$ is provided at the output port $P_{OUT}$. If the alternative load structure 20A does not include the conversion functionality, the pair of combined RF output signals $RF_{OUT^+}$ and $RF_{OUT^-}$ will be provided to a pair of output ports $P_{OUT^+}$ and $P_{OUT^-}$.

In some applications, the broadband LNA structure 10 may further include an alternative phasing degeneration block 22A, which is configured to assist with the phasing shifting between the alternative main signal path (i.e., a path through the alternative main LNA 12A) and the alternative offset signal path (i.e., a path through the alternative offset LNA 14A). The alternative phasing degeneration block 22A provides degeneration impedances to the alternative main LNA 12A and the alternative offset LNA 14A. The transconductance gain of the alternative main LNA 12A/the alternative offset LNA 14A is dependent on the corresponding degeneration impedance. If the degeneration impedance is real (e.g., resistive), no phase shift is created in the alternative main LNA 12A/alternative offset LNA 14A itself. If the degeneration impedance is complex (e.g. inductive), the alternative main LNA 12A/alternative offset LNA 14A itself will create additional phase shift that is contributing to the overall phase difference between the alternative main signal path and the alternative offset signal path. The total phase differences are the summation between the passive network phase shifts (e.g., from the alternative input splitter 16A) and the active phase shift (e.g., from the alternative main LNA 12A and the alternative offset LNA 14A).

The alternative phasing degeneration block 22A may also be configured to improve the linearity of the alternative main LNA 12A and the alternative offset LNA 14A. The alternative phasing degeneration block 22A are connected between the alternative main LNA 12A and a reference level RL (e.g., a common node) and between the alternative offset LNA 14A and the reference level RL (e.g., the common node). When the alternative phasing degeneration block 22A is omitted in the alternative broadband LNA structure 10A, the alternative main LNA 12A and the alternative offset LNA 14A may be directly connected to the reference level RL (e.g., the common node), respectively. The alternative broadband LNA structure 10A can be implemented either on-chip, on the laminate, or a combination of the two.

The inductors from the alternative phasing degeneration block 22A may be magnetically coupled, electrically coupled, or both. As such they may form an auto-transformer or a galvanic isolated transformer. Two or more turns may be included in the transformer.

Figure 5:
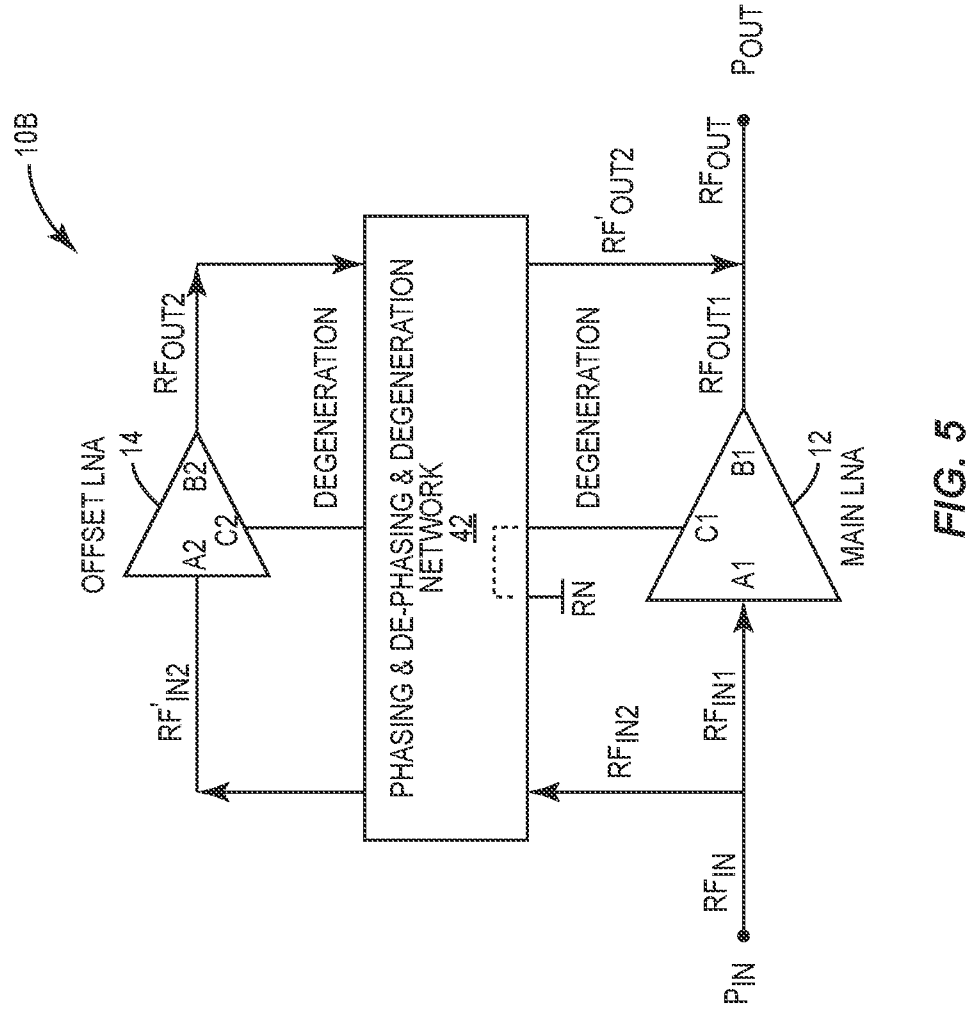

In FIG. 1, the input splitter 16 achieves the phase shifting at the input side, while the output combiner 18 achieves the phase shifting at the output side. In some applications, a single phasing and de-phasing network can perform phase shifting for both inputs and outputs. FIG. 5 illustrates another alternative broadband LNA structure 10B including the main LNA 12, the offset LNA 14, and a phasing and de-phasing network 42 connected between the main LNA 12 and the offset LNA 14. In this embodiment, the main LNA 12 is configured to receive a first input portion $RF_{IN1}$ of the RF input signal $RF_{IN}$ and provide a first output portion $RF_{OUT1}$ of the RF output signal $RF_{OUT}$. The phasing and de-phasing network 42 is configured to receive a second input portion $RF_{IN2}$ of the RF input signal $RF_{IN}$ and provide a shifted second input portion $RF'_{IN2}$ to the offset LNA 14. Herein, the shifted second input portion $RF'_{IN2}$ has a phase shift from the second input portion $RF_{IN2}$, and thus also has a phase shift from the first input portion $RF_{IN1}$ fed to the main LNA 12. The offset LNA 14 is configured to receive the shifted second input portion $RF'_{IN2}$ and provide a second output portion $RF_{OUT2}$ back to the phasing and de-phasing network 42. Herein, the main LNA 12 and the offset LNA 14 will work on different phases of the RF input signal $RF_{IN}$, and the offset LNA 14 will have a frequency transfer function that is offset in frequency from the main LNA 12. The first RF output portion $RF_{OUT1}$ from the main LNA 12 and the second RF output portion $RF_{OUT2}$ have different signal phases at least due to the phase difference between the first RF input portion $RF_{IN1}$ and the second RF input portion $RF_{IN2}$. The phasing and de-phasing network 42 is configured to re-align the second RF output signal $RF_{OUT2}$ with the first RF output signal $RF_{OUT1}$ (e.g., reduce the phase difference between the first RF output signal $RF_{OUT1}$ and the second RF output signal $RF_{OUT2}$). Herein, the phasing and de-phasing network 42 is configured to provide a shifted second output portion $RF_{OUT2}$, which has a substantially same phase as the first RF output signal $RF_{OUT1}$. In consequence, the first output portion $RF_{OUT1}$ and the shifted second output portion $RF'_{OUT2}$ can be added together to form a combined RF output signal $RF_{OUT}$.

In some applications, the phasing and de-phasing network may also provide phasing degeneration to the main LNA 12 and the offset LNA 14 for assisting in the phasing shift of the main and the offset signal paths, while also helping to improve the LNA linearity. For instance, inductance between the input port $P_{IN}$ and the terminal A2 of the offset LNA 14 may match the inductance between the terminal C2 of the offset LNA 14 and the reference level RL (e.g., ground). For another instance, when there is no inductance between the input port $P_{IN}$ and the terminal A1 of the main LNA 12, the terminal C1 of the main LNA 12 may be directly connected to the reference level RL (e.g., ground).

Figure 6:
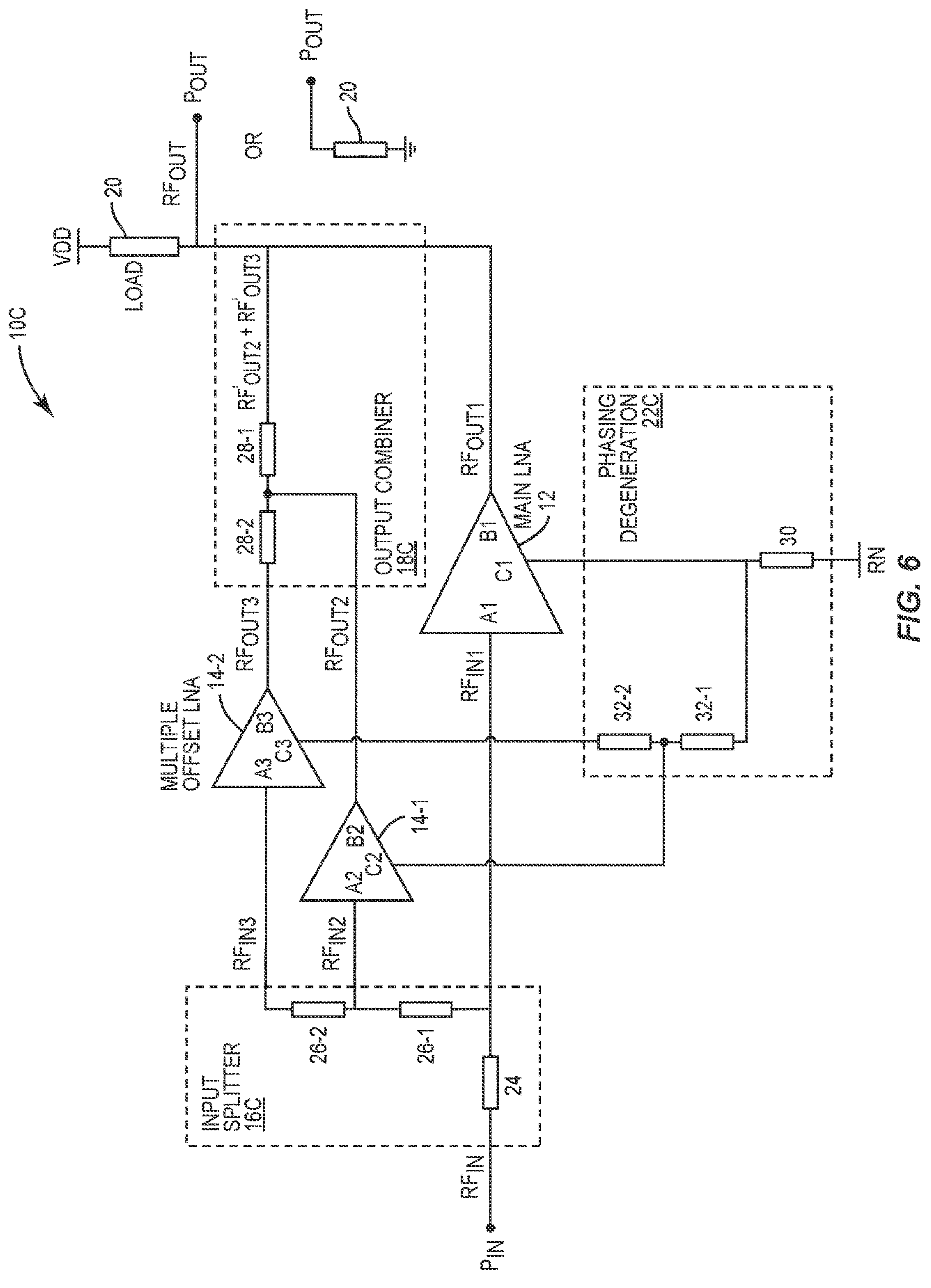

In some applications, there might be more than one offset LNA 14 interconnected to the main LNA 12. FIG. 6 illustrates another alternative broadband LNA structure 10C including a first offset LNA 14-1 and a second offset LNA 14-2 combined with the main LNA 12. The alternative broadband LNA structure 10C also includes an alternative input splitter 16C and an alternative output combiner 18C for interconnection among the main LNA 12, the first offset LNA 14-1, and the second offset LNA 14-2. Herein, the main LNA 12, the first offset LNA 14-1, and the second offset LNA 14-2 are parallel to each other.

In detail, the alternative input splitter 16C is connected to an input port $P_{IN}$, and is configured to split the RF input signal $RF_{IN}$ received at the input port $P_{IN}$ into a first RF input signal $RF_{IN1}$, a second RF input signal $RF_{IN2}$ and a third RF input signal $RF_{IN3}$, which have a signal shift from each other. The main LNA 12 is configured to receive the first RF input signal $RF_{IN1}$ and provide a first RF output signal $RF_{OUT1}$, the first offset LNA 14-1 is configured to receive the second RF input signal $RF_{IN2}$ and provide a second RF output signal $RF_{OUT2}$, and the second offset LNA 14-2 is configured to receive the third RF input signal $RF_{IN3}$ and provide a third RF output signal $RF_{OUT3}$. As such, the main LNA 12, the first offset LNA 14-1, and the second offset LNA 14-2 will work on different phases of the RF input signal $RF_{IN}$. The first offset LNA 14-1 will have a frequency transfer function that is offset in frequency from the main LNA 12 and the second offset LNA 14-2, and The second offset LNA 14-2 will have a frequency transfer function that is offset in frequency from the main LNA 12 and the first offset LNA 14-1. The first RF output signal $RF_{OUT1}$, the second RF output signal $RF_{OUT2}$, and the third RF output signal $RF_{OUT3}$ have different signal phases due to the phase shifts among the first RF input signal $RF_{IN1}$, the second RF input signal $RF_{IN2}$, and the third RF input signal $RF_{IN3}$.

The alternative output combiner 18C is configured to receive the first RF output signal $RF_{OUT1}$ from the main LNA 12, the second RF output signal $RF_{OUT2}$ from the first offset LNA 14-1, and the third RF output signal $RF_{OUT3}$ from the second offset LNA 14-2. The alternative output combiner 18C is configured to re-align the first RF output signal $RF_{OUT1}$, the second RF output signal $RF_{OUT2}$, and the third RF output signal $RF_{OUT3}$ (e.g., reduce the phase differences among the first RF output signal $RF_{OUT1}$, the second RF output signal $RF_{OUT2}$, and the third RF output signal $RF_{OUT3}$, opposite phase shifting in the alternative output combiner 18C compared to the phase shifting in the alternative input splitter 16C), such that the first RF output signal $RF_{OUT1}$, the second RF output signal $RF_{OUT2}$, and the third RF output signal $RF_{OUT3}$ can be combined together to provide a combined RF output signal $RF_{OUT}$ to the output port $P_{OUT}$. Herein, the phase shifting in the alternative input splitter 16C provide phase-shifted signal paths through the main LNA 12, the first offset LNA 14-1, and the second offset LNA 14-2, respectively. Combining these phase-shifted signal paths will result in a broad bandwidth of the alternative broadband LNA structure 10C.

In some applications, the alternative broadband LNA structure 10C may further include the load structure 20, which may be connected between the output port $P_{OUT}$ and the power supply $V_{DD}$ or connected between the output port $P_{OUT}$ and ground. In some applications, the alternative broadband LNA structure may further include an alternative phasing degeneration block 22C, which is configured to assist with the phase shifting among the main signal path (i.e., path through the main LNA 12), the first offset signal path (i.e., the path through the first offset LNA 14-1), and the second offset signal path (i.e., the path through the second offset LNA 14-2). The alternative phasing degeneration block 22C provides degeneration impedances to the main LNA 12, the first offset LNA 14-1, and the second offset LNA 14-2. The transconductance gain of the main LNA 12/the first offset LNA 14-1/the second offset LNA 14-2 is dependent on the corresponding degeneration impedance. If the degeneration impedance is real (e.g., resistive), no phase shift is created in the main LNA 12/first offset LNA 14-1/second offset LNA 14-2 itself. If the degeneration impedance is complex (e.g. inductive), main LNA 12/first offset LNA 14-1/second offset LNA 14-2 itself will create additional phase shift that is contributing to the overall phase difference among the main signal path, the first offset signal path, and the second offset signal path. The total phase difference is the summation between the passive network phase shift (e.g., from the alternative input splitter 16C) and the active phase shift (e.g., from the main LNA 12, the first offset LNA 14-1, and the second offset LNA 14-2).

The alternative phasing degeneration block 22C may also be configured to improve the linearity of the main LNA 12, the first offset LNA 14-1, and the second offset LNA 14-2. The alternative phasing degeneration block 22C are connected between the main LNA 12 and the reference level RL (e.g., ground), between the first offset LNA 14-1 and the reference level RL (e.g., ground), and between the second offset LNA 14-2 and the reference level RL (e.g., ground). When the alternative phasing degeneration block 22C is omitted in the alternative broadband LNA structure 10C, the main LNA 12, the first offset LNA 14-1, and the second offset LNA 14-2 may be directly connected to the reference level RL (e.g., ground), respectively.

The alternative broadband LNA structure 10C can be implemented either on-chip, on the laminate or a combination of the two. In one embodiment, the alternative input splitter 16C may be achieved by the main input inductance 24, a first offset input inductance 26-1, and a second offset input inductance 26-2. The main input inductance 24 is connected between the input port $P_{IN}$ and the terminal A1 of the main LNA 12, the first offset input inductance 26-1 is connected between the main input inductance 24 and a terminal A2 of the first offset LNA 14-1, and the second offset input inductance 26-2 is connected between the first offset input inductance 26-1 and a terminal A3 of the second offset LNA 14-2. As such, the main input inductance 24 is connected between the input port $P_{IN}$ and the main LNA 12, the main input inductance 24 and the first offset input inductance 26-1 are connected in series between the input port $P_{IN}$ and the first offset LNA 14-1, and the main input inductance 24, the first offset input inductance 26-1, and the second offset input inductance 26-2 are connected in series between the input port $P_{IN}$ and the second offset LNA 14-2. Different inductances lead to different phase shifts. In consequence, the input signal $RF_{IN}$ received at the input port $P_{IN}$ can be split into three signals (i.e., the first RF input signal $RF_{IN1}$, the second RF input signal $RF_{IN2}$, and the third RF input signal $RF_{IN3}$) with different phases.

The main input inductance 24, the first offset input inductance 26-1, and the second offset input inductance 26-2 may each be implemented by one or more inductors (e.g., on-chip inductors, printed circuit inductors, or surface mounted inductors). In one embodiment, main input inductance 24, the first offset input inductance 26-1, and the second offset input inductance 26-2 may be magnetically coupled, electrically coupled, or both (not shown). Notice that the alternative input splitter 16C may include a second or higher order passive network, which could provide the phase shifting in the main signal path (i.e., the path through the main LNA 12), the first offset signal path (i.e., the path through the first offset LNA 14-1), and the second offset signal path (i.e., the path through the second offset LNA 14-2). Typically, the higher order of the alternative input splitter 16, the larger phase shift among the main signal path, the first offset signal path, and the second offset signal path.

In one embodiment, the alternative output combiner 18C may be achieved by a first offset output inductance 28-1 and a second offset output inductance 28-2. Herein, the first offset output inductance 28-1 is connected between a terminal B2 of the first offset LNA 14-1 and the output port $P_{OUT}$, the second offset output inductance 28-2 is connected between a terminal B3 of the second offset LNA 14-2 and the first offset output inductance 28-1, and the terminal B1 of the main LNA 12 is directly connected to the output port $P_{OUT}$. The first offset output inductance 28-1 is configured to decrease a phase difference between the first RF output signal $RF_{OUT1}$ and the second RF output signal $RF_{OUT2}$, which at least comes from the phase difference between the first RF input signal $RF_{IN1}$ and the second RF input signal $RF_{IN2}$. A combination of the first offset output inductance 28-1 and the second offset output inductance 28-2 are configured to decrease a phase difference between the first RF output signal $RF_{OUT1}$ and the third RF output signal $RF_{OUT3}$, which at least comes from the phase difference between the first RF input signal $RF_{IN1}$ and the third RF input signal $RF_{IN3}$. As such, the first offset output inductance 28-1 and the second offset output inductance 28-2 are configured to re-align the first RF output signal $RF_{OUT1}$, the second RF output signal $RF_{OUT2}$, and the third RF output signal $RF_{OUT3}$. In consequence, a shifted second RF output signal $RF'_{OUT2}$ (after the first offset output inductance 28-1), a shifted third RF output signal $RF'_{OUT3}$ (after both the first offset output inductance 28-2 and the first offset output inductance 28-1), and the first RF output signal $RF_{OUT1}$ may have a substantially same phase, and can be added as one combined RF output signal $RF_{OUT}$.

The first offset output inductance 28-1 and the second offset output inductance 28-2 may each be implemented by one or more inductors (e.g., on-chip inductors, printed circuit inductors, or surface mounted inductors). In one embodiment, the first offset output inductance 28-1, the second offset output inductance 28-2, and the load structure 20 may also be magnetically coupled, electrically coupled, or both (not shown).

In one embodiment, the alternative phasing degeneration block 22C may be achieved by the main degeneration inductance 30, a first offset degeneration inductance 32-1, and a second offset degeneration inductance 32-2. The main degeneration inductance 30 is connected between the terminal C1 of the main LNA 12 and the reference level RL (e.g., ground), the first offset degeneration inductance 32-1 is connected between a terminal C2 of the first offset LNA 14-1 and the main degeneration inductance 30, and the second offset degeneration inductance 32-2 is connected between a terminal C3 of the second offset LNA 14-2 and the first offset degeneration inductance 32-1. As such, the main degeneration inductance 30 is connected between the main LNA 12 and the reference level RL (e.g., ground), the first offset degeneration inductance 32-1 and the main degeneration inductance 30 are connected in series between the first offset LNA 14-1 and the reference level RL (e.g., ground), and the second offset degeneration inductance 32-2, the first offset degeneration inductance 32-1, and the main degeneration inductance 30 are connected in series between the second offset LNA 14-2 and the reference level RL (e.g., ground). Due to the different degeneration impedances for the main LNA 12, the first offset LNA 14-1, and the second offset 14-2, there will be additional phase shift generated among the main LNA 12, the first offset LNA 14-1 and the second offset LNA 14-2, which will contribute to the overall phase difference among the main signal path, the first offset signal path, and the second offset signal path. In addition, the main degeneration inductance 30 matches the main input inductance 24, so as to improve the linearity of the main LNA 12. A combination of the first offset degeneration inductance 32-1 and the main degeneration inductance 30 matches the combination of the first offset input inductance 26-1 and the main input inductance 24, so as to improve the linearity of the first offset LNA 14-1. A combination of the second offset degeneration inductance 32-2, the first offset degeneration inductance 32-1, and the main degeneration inductance 30 matches the combination of the second offset input inductance 26-2, the first offset input inductance 26-1, and the main input inductance 24, so as to improve the linearity of the second offset LNA 14-2.

The main degeneration inductance 30, the first offset degeneration inductance 32-1, and the second offset degeneration inductance 32-2 may each be implemented by one or more inductors (e.g., on-chip inductors, printed circuit inductors, or surface mounted inductors). In one embodiment, main degeneration inductance 30, the first offset degeneration inductance 32-1, and the second offset degeneration inductance 32-2 may be magnetically coupled, electrically coupled, or both (not shown). Notice that the alternative phasing degeneration block 22C may include a second or higher order passive network, which could provide the additional phase shifting among the main signal path, the first offset signal path, and the second offset signal path. Typically, the higher order of the alternative phasing degeneration block 22C, the larger phase shift will be added among the main signal path, the first offset signal path, and the second offset signal path.

Herein, each of the main LNA 12, the first offset LNA 14-1 and the second offset LNA 14-2 may be implemented by one or more transistors, such as BJTs, HBTs, MOSFETs in bulk CMOS or SOI CMOS, pHEMTs, JFETs, and etc. In addition, each of the main LNA 12, the first offset LNA 14-1 and the second offset LNA 14-2 may be implemented with the configurations illustrated in FIG. 3A or 3B.

Figure 7A:
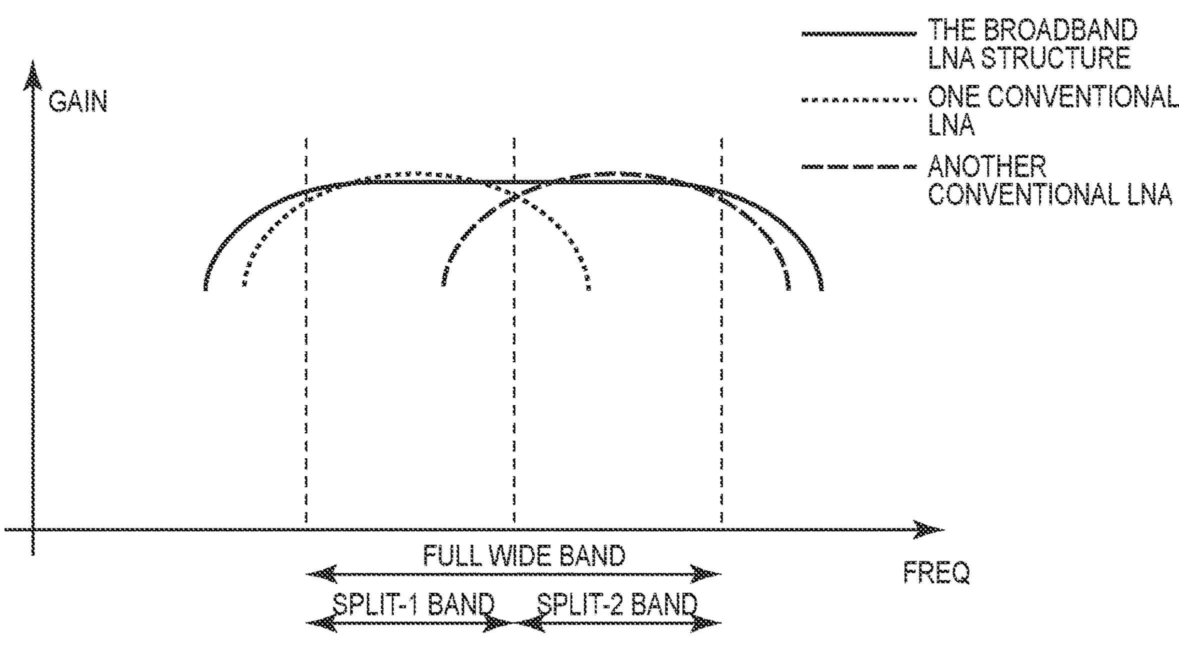
FIGS. 7A and 7B illustrate performance comparisons between a conventional LNA and the broadband LNA shown in FIG. 1.
Figure 7B:
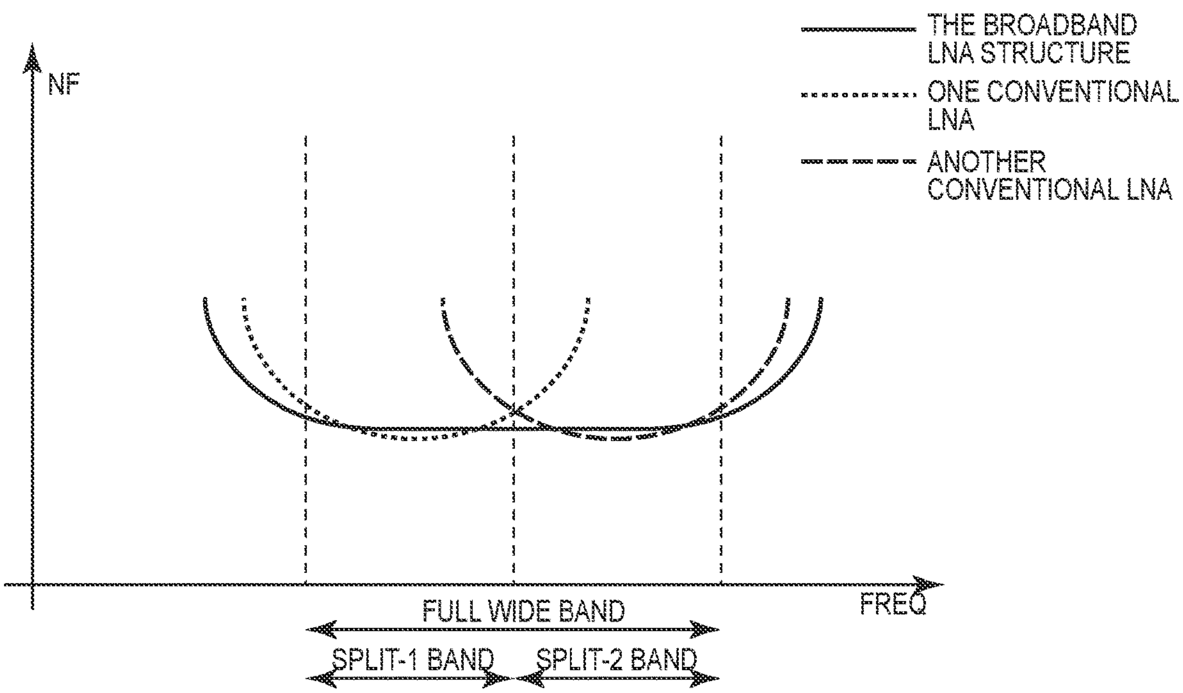

The broadband LNA structure 10/10A/10B/10C utilizes one or more passive networks (e.g., the input splitter 16/16A/16C, the output combiner 18/18A/18C, and the phasing degeneration block 22/22A/22C, or the phasing and de-phasing network 42) in conjunction with one or more active offset LNAs to provide a wide bandwidth characteristic and low NF characteristic for communication bands in 5G. FIGS. 7A and 7B illustrate performance comparisons between a conventional single LNA and the broadband LNA 10/10A/10B/10C shown in present disclosure. As shown in FIG. 7A, one conventional LNA may only cover a half of the band (e.g., split-1 band or split-2 band) the broadband LNA 10/10A/10B/10C covers (e.g., full wide band). Two conventional LNAs may cover the full wide band but have limitations in terms of intra-band carrier aggregation. In FIG. 7B, the broadband LNA 10/10A/10B/10C has a low NF during the full wide band, while the conventional LNA may only retain low NF in a designed band (e.g., split-1 band or split-2 band) and increase significantly out of the designed band. As such, utilizing two conventional LNAs may have relatively high NF at the intra-band of these two conventional LNAs. In addition, using the active solution for the LNA bandwidth widening will result in a relatively small footprint and a small number of component counts.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A broadband low noise amplifier (LNA) structure comprising:

an input port;

an output port;

a main LNA;

a first offset LNA parallel with the main LNA;

an input splitter configured to split a radio frequency (RF) input signal received from the input port into a first RF input signal and a second RF input signal, which are fed to the main LNA and the first offset LNA, respectively, wherein:

the first RF input signal and the second RF input signal have a phase difference;

the main LNA is configured to provide a first RF output signal based on the first RF input signal; and the first offset LNA is configured to provide a second RF output signal based on the second RF input signal, wherein the first RF output signal and the second RF output signal have a phase difference due to the phase difference between the first RF input signal and the second RF input signal; and an output combiner configured to re-align the first RF output signal and the second RF output signal by decreasing the phase difference between the first RF output signal and the second RF output signal, and configured to combine the first and second RF output signals to provide a combined RF output signal to the output port, wherein:

a main signal path, which extends from the input port, through the input splitter, through the main LNA, through the output combiner, and to the output port, includes a main total inductance; and a first offset signal path, which extends from the input port, through the input splitter, through the first offset LNA, through the output combiner, and to the output port, includes a first offset total inductance, wherein the main total inductance and the first offset total inductance have different values.

2. The broadband LNA structure of claim 1 further comprising a phasing degeneration block, which is connected between the main LNA and a reference level and is also connected between the first offset LNA and the reference level, wherein the phasing degeneration block is configured to add a phase shift between a main signal path through the main LNA and the first offset signal path through the offset LNA.

3. The broadband LNA structure of claim 2 wherein the phasing degeneration block is configured to improve linearity of the main LNA and linearity of the first offset.

4. The broadband LNA structure of claim 1 wherein the input splitter includes a main input inductance and an offset input inductance, wherein:

the main input inductance is connected between the input port and a first terminal of the main LNA, and the main input inductance and the offset input inductance are connected in series between the input port and a first terminal of the first offset LNA; and the first terminal of the main LNA is a terminal to receive the first RF input signal, and the first terminal of the first offset LNA is a terminal to receive the second RF input signal.

5. The broadband LNA structure of claim 4 wherein the main input inductance and the offset input inductance are magnetically coupled, electrically coupled via a coupling capacitor, or both magnetically and electrically coupled.

6. The broadband LNA structure of claim 5 wherein the main input inductance and the offset input inductance form an auto-transformer or a galvanic isolated transformer.

7. The broadband LNA structure of claim 4 wherein the output combiner includes an offset output inductance, wherein:

the offset output inductance is connected between a second terminal of the first offset LNA and an output port, and a second terminal of the main LNA is directly connected to the output port;

the second terminal of the main LNA is a terminal to provide the first RF output signal, and the second terminal of the first offset LNA is a terminal to provide the second RF output signal; and the main total inductance comprises the main input inductance, and the first offset total inductance comprises a combination of the main input inductance, the offset input inductance, and the offset output inductance.

8. The broadband LNA structure of claim 7 further comprising a load structure, which is connected between the output port and a power supply or between the output port and ground.

9. The broadband LNA structure of claim 8 wherein the offset output inductance and the load structure are magnetically coupled, electrically coupled via a coupling capacitor, or both magnetically and electrically coupled.

10. The broadband LNA structure of claim 7 wherein:

the main LNA is a first field-effect transistor (FET) including a drain, a gate, and a source;

the gate of the first FET is the first terminal of the main LNA, the drain of the first FET is the second terminal of the main LNA, and the source of the first FET is directly connected to the reference level;

the first offset LNA is a second FET including a drain, a gate, and a source; and the gate of the second FET is the first terminal of the first offset LNA, the drain of the second FET is the second terminal of the first offset LNA, and the source of the second FET is directly connected to the reference level.

11. The broadband LNA structure of claim 7 wherein:

the main LNA includes a first FET with a drain, a gate, and a source, a second FET with a drain, a gate, and a source, and a first capacitor, wherein:

the gate of the first FET is the first terminal of the main LNA, the source of the first FET is directly connected to the reference level, the drain of the first FET is connected to the source of the second FET, the gate of the second FET is connected to ground through the first capacitor, and the drain of the second FET is the second terminal of the main LNA; and the first offset LNA includes a third FET with a drain, a gate, and a source, a fourth FET with a drain, a gate, and a source, and a second capacitor, wherein:

the gate of the third FET is the first terminal of the first offset LNA, the source of the third FET is directly connected to the reference level, the drain of the third FET is connected to the source of the fourth FET, the gate of the fourth FET is connected to ground through the second capacitor, and the drain of the fourth FET is the second terminal of the first offset LNA.

12. The broadband LNA structure of claim 7 further comprising a phasing degeneration block that includes a main degeneration inductance and an offset degeneration inductance, wherein:

the main degeneration inductance is connected between a third terminal of the main LNA and a reference level, and the main degeneration inductance and the offset degeneration inductance are connected in series between a third terminal of the first offset LNA and the reference level; and the third terminal of the main LNA is different from the first and second terminals of the main LNA, and the third terminal of the first offset LNA is different from the first and second terminals of the first offset LNA.

13. The broadband LNA structure of claim 12 wherein the main degeneration inductance and the offset degeneration inductance are magnetically coupled, electrically coupled via a coupling capacitor, or both magnetically and electrically coupled.

14. The broadband LNA structure of claim 13 wherein the main degeneration inductance and the offset degeneration inductance form an auto-transformer or a galvanic isolated transformer.

15. The broadband LNA structure of claim 12 wherein:

the main LNA is a first FET including a drain, a gate, and a source;

the gate of the first FET is the first terminal of the main LNA, the drain of the first FET is the second terminal of the main LNA, and the source of the first FET is the third terminal of the main LNA;

the first offset LNA is a second FET including a drain, a gate, and a source; and the gate of the second FET is the first terminal of the first offset LNA, the drain of the second FET is the second terminal of the first offset LNA, and the source of the second FET is the third terminal of the first offset LNA.

16. The broadband LNA structure of claim 12 wherein:

the main LNA includes a first FET with a drain, a gate, and a source, a second FET with a drain, a gate, and a source, and a first capacitor, wherein:

the gate of the first FET is the first terminal of the main LNA, the source of the first FET is the third terminal of the main LNA, the drain of the first FET is connected to the source of the second FET, the gate of the second FET is connected to ground through the first capacitor, and the drain of the second FET is the second terminal of the main LNA; and the first offset LNA includes a third FET with a drain, a gate, and a source, a fourth FET with a drain, a gate, and a source, and a second capacitor, wherein:

the gate of the third FET is the first terminal of the first offset LNA, the source of the third FET is the third terminal of the first offset LNA, the drain of the third FET is connected to the source of the fourth FET, the gate of the fourth FET is connected to ground through the second capacitor, and the drain of the fourth FET is the second terminal of the first offset LNA.

17. The broadband LNA structure of claim 1, wherein the main LNA includes at least one of a bipolar junction transistor (BJT), a hetero-junction bipolar transistor (HBT), a metal-oxide-semiconductor field-effect transistor (MOSFET) in bulk complementary metal-oxide-semiconductors (CMOS) or silicon on insulator (SOI) CMOS, a pseudomorphic high-electron-mobility transistor (pHEMT), and a junction-gate field-effect transistors (JFET).

18. The broadband LNA structure of claim 1, wherein the first offset LNA includes at least one of a BJT, an HBT, an MOSFET in bulk CMOS or SOI CMOS, a pHEMT, and a JFET.

19. The broadband LNA structure of claim 1, wherein each of the main LNA, the first offset LNA, the input splitter, and the output combiner has a differential configuration, which receives a pair of differential signals and provides another pair of differential signals, wherein:

the RF input signal is included in a pair of RF input signals that are received by the input splitter;

the first RF input signal is included in a pair of first RF input signals that are provided by the input splitter and fed to the main LNA;

the second RF input signal is included in a pair of second RF input signals that are provided by the input splitter and fed to the first offset LNA;

the first RF output signal is included in a pair of first RF output signals that are provided by the main LNA and fed to the output combiner;

the second RF output signal is included in a pair of second RF output signals that are provided by the first offset LNA and fed to the output combiner; and the combined RF output signal is included in a pair of combined RF output signals that are provided by the output combiner based on the pair of first RF output signals and the pair of second RF output signals.

20. The broadband LNA structure of claim 19 further comprising a converter, which is configured to receive the pair of combined RF output signals and convert the pair of combined RF output signals to a single-ended RF output signal.

21. The broadband LNA structure of claim 1 further comprising a second offset LNA, wherein:

the second offset LNA is parallel with the main LNA;

the input splitter is configured to split the RF input signal the first RF input signal, the second RF input signal, and the third RF input signal, which are fed to the main LNA, the first offset LNA, and the second offset LNA, respectively;

the first RF input signal, the second RF input signal, and the third RF input signal have a phase difference from each other;

the second offset LNA is configured to provide a third RF output signal based on the third RF input signal, wherein the first RF output signal, the second RF output signal, and the third RF output signal have a phase difference from each other;

the output combiner is configured to re-align the first RF output signal, the second RF output signal, and the third RF output signal by reducing the phase difference between each two of the first RF output signal, the second RF output signal, and the third RF output signal, and configured to combine the first, second, and third RF output signals to provide the combined RF output signal; and a second offset signal path, which extends from the input port, through the input splitter, through the second offset LNA, through the output combiner, and to the output port, includes a second offset total inductance, wherein the main total inductance, the first offset total inductance, and the second offset total inductance have different values.

22. The broadband LNA structure of claim 21 wherein the input splitter includes a main input inductance, a first offset input inductance, and a second offset inductance, wherein:

the main input inductance is coupled between the input port and a first terminal of the main LNA, the main input inductance and the first offset input inductance are coupled in series between the input port and a first terminal of the first offset LNA, and the main input inductance, the first offset input inductance, and the second offset input inductance are coupled in series between the input port and a first terminal of the second offset LNA; and the first terminal of the main LNA is a terminal to receive the first RF input signal, the first terminal of the first offset LNA is a terminal to receive the second RF input signal, and the first terminal of the second offset LNA is a terminal to receive the third RF input signal.

23. The broadband LNA structure of claim 22 wherein the main input inductance, the first offset input inductance, and the second offset input inductance are magnetically coupled, electrically coupled via a coupling capacitor, or both magnetically and electrically coupled.

24. The broadband LNA structure of claim 22 wherein the output combiner includes a first offset output inductance and a second offset output inductance, wherein:

a second terminal of the main LNA is directly coupled to an output port, the first offset output inductance is coupled between a second terminal of the first offset LNA and the output port, and the second offset output inductance and the first offset output inductance are coupled in series between a second terminal of the second offset LNA and the output port;

the second terminal of the main LNA is a terminal to provide the first RF output signal, the second terminal of the first offset LNA is a terminal to provide the second RF output signal, the second terminal of the second offset LNA is a terminal to provide the third RF output signal; and the main total inductance is the main input inductance, the first offset total inductance is a combination of the main input inductance, the first offset input inductance, and the first offset output inductance, and the second offset total inductance is a combination of the main input inductance, the first offset input inductance, the second offset input inductance, the first offset output inductance, and the second offset output inductance.

25. The broadband LNA structure of claim 24 wherein first offset output inductance and a second offset output inductance are magnetically coupled, electrically coupled via a coupling capacitor, or both magnetically and electrically coupled.

26. The broadband LNA structure of claim 24 further comprising a phasing degeneration block that includes a main degeneration inductance, a first offset degeneration inductance, and a second offset degeneration inductance, wherein:

the main degeneration inductance is coupled between a third terminal of the main LNA and a reference level, the main degeneration inductance and the first offset degeneration inductance are coupled in series between a third terminal of the first offset LNA and the reference level, and the main degeneration inductance, the first offset degeneration inductance, and the second offset degeneration inductance are coupled in series between a third terminal of the second offset LNA and the reference level;

the third terminal of the main LNA is different from the first and second terminals of the main LNA, the third terminal of the first offset LNA is different from the first and second terminals of the first offset LNA, and the third terminal of the second offset LNA is different from the first and second terminals of the second offset LNA.

27. The broadband LNA structure of claim 26 wherein the main degeneration inductance, the first offset degeneration inductance, and the second offset degeneration inductance are magnetically coupled, electrically coupled via a coupling capacitor, or both magnetically and electrically coupled.

28. The broadband LNA structure of claim 26, wherein the second offset LNA includes at least one of a BJT, an HBT, an MOSFET in bulk CMOS or SOI CMOS, a pHEMT, and a JFET.

29. A broadband low noise amplifier (LNA) structure comprising:

an input port;

an output port;

a main LNA;

an offset LNA; and a phasing and de-phasing network coupled between the main LNA and the offset LNA, wherein:

the main LNA is configured to directly receive a first portion of a radio frequency (RF) input signal from the input port and directly provide a first portion of a RF output signal to the output port;

the offset LNA is configured to receive an offset RF input signal from the phasing and de-phasing network, and provide an offset RF output signal back to the phasing and de-phasing network; and the phasing and de-phasing network is configured to directly receive a second portion of the RF input signal from the input port, configured to shift phase of the second portion of the RF input signal to provide the offset RF input signal to the offset LNA, configured to receive the offset RF output signal from the offset LNA, and configured to directly provide a second portion of the RF output signal to the output port, wherein the second portion of the RF output signal and the first portion of a RF output signal are aligned in phase.

30. The broadband LNA structure of claim 1, wherein:

impedance between the input port and the first offset LNA in the first offset signal path is greater than impedance between the input port and the main LNA in the main signal path; and impedance between the first offset LNA and the output port in the first offset signal path is greater than impedance between the main LNA and the output port in the main signal path.

* * * * *